United States Patent
Rao et al.

(10) Patent No.: US 8,625,333 B2
(45) Date of Patent: Jan. 7, 2014

(54) MEMORY DEVICE HAVING MEMORY CELLS WITH WRITE ASSIST FUNCTIONALITY

(75) Inventors: Setti Shanmukheswara Rao, Bangalore (IN); Vinod Rachamadugu, Kurnool (IN)

(73) Assignee: LSI Corporation, San Jose, CA (US)

( * ) Notice: Subject to any disclaimer, the term of this patent is extended or adjusted under 35 U.S.C. 154(b) by 183 days.

(21) Appl. No.: 13/031,798

(22) Filed: Feb. 22, 2011

(65) Prior Publication Data

US 2012/0212996 A1 Aug. 23, 2012

(51) Int. Cl.
*G11C 11/00* (2006.01)

(52) U.S. Cl.
USPC .......................................... 365/154

(58) Field of Classification Search
USPC ........................................... 365/154
See application file for complete search history.

(56) References Cited

U.S. PATENT DOCUMENTS

| | | | | |
|---|---|---|---|---|
| 3,575,617 | A * | 4/1971 | Burns | 327/210 |
| 6,418,045 | B2 * | 7/2002 | Camarota | 365/156 |
| 7,633,830 | B2 | 12/2009 | Evans et al. | |
| 2007/0109878 | A1 | 5/2007 | Gouin et al. | |
| 2009/0049366 | A1 * | 2/2009 | Toda | 714/782 |
| 2009/0086554 | A1 | 4/2009 | Chanussot et al. | |
| 2009/0262594 | A1 | 10/2009 | Bhatia | |
| 2010/0020590 | A1 * | 1/2010 | Hsueh et al. | 365/154 |
| 2010/0097844 | A1 | 4/2010 | Liu | |

FOREIGN PATENT DOCUMENTS

WO 2009/138739 A2 11/2009

OTHER PUBLICATIONS

U.S. Appl. No. 12/974,441, filed in the name of V. Rachamadugu et al. on Dec. 21, 2010 and entitled "Memory Device Having Memory Cells with Enhanced Low Voltage Write Capability,".

* cited by examiner

*Primary Examiner* — Hoai V Ho
*Assistant Examiner* — Min Huang
(74) *Attorney, Agent, or Firm* — Ryan, Mason & Lewis, LLP

(57) ABSTRACT

A memory device includes a memory array comprising a plurality of memory cells. At least a given one of the memory cells comprises a pair of cross-coupled inverters and associated write assist circuitry. The write assist circuitry comprises first switching circuitry coupled between a supply node of a device of the first inverter and a supply node of the memory cell, and second switching circuitry coupled between a supply node of a device of the second inverter and the supply node of the memory cell. The first and second switching circuitry are separately controlled, with the first switching circuitry being controlled using a wordline and an uncomplemented bitline of the memory device, and the second switching circuitry being controlled using the wordline and a complemented bitline of the memory device.

20 Claims, 6 Drawing Sheets

US 8,625,333 B2

MEMORY DEVICE HAVING MEMORY CELLS WITH WRITE ASSIST FUNCTIONALITY

RELATED APPLICATION

The present invention is related to the invention disclosed in co-pending U.S. patent application Ser. No. 12/974,441, filed Dec. 21, 2010 and entitled "Memory Device having Memory Cells with Enhanced Low Voltage Write Capability," the disclosure of which is hereby incorporated by reference herein in its entirety.

FIELD OF THE INVENTION

The present invention relates generally to semiconductor memory devices, and more particularly to techniques for configuring such devices to provide write assist functionality under various operating conditions.

BACKGROUND OF THE INVENTION

A semiconductor memory device typically includes an array of memory cells arranged in rows and columns, with each memory cell configured to store one or more bits of data. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into a precharge phase and an active phase, with the precharge phase being used to precharge the bitlines to a precharge voltage, and the active phase being used to read or write one or more memory cells of the array. Reading a given memory cell generally comprises transferring data stored within that cell to its corresponding bitline, and writing a given memory cell generally comprises transferring data into that cell from its corresponding bitline.

As transistor dimensions continue to shrink, it is becoming increasingly difficult to prevent local mismatch between the memory cell transistors of the memory device. This can adversely impact memory device performance, such as the ability to consistently write data to the memory cells at low voltages. For example, a conventional six-transistor (6T) static random access memory (SRAM) memory cell includes two NMOS pass gate transistors and a pair of cross-coupled inverters, with the two inverters collectively comprising two PMOS pull-up transistors and two NMOS pull-down transistors. In writing data to a conventional SRAM memory cell of this type, the bitline is discharged to a logic low level and the wordline is set to a logic high level. If in a given memory cell, worst case local variations cause the threshold voltage in the NMOS pass gate transistors to increase and the threshold voltage in the PMOS pull-up transistors to decrease, then the NMOS pass gate transistor coupled to the bitline may not be able to drive the corresponding inverter input below its trip point, and the memory cell will not be written with the data. For a memory cell with worst case local variations, at lower write voltages the overdrive of the NMOS pass gate transistor decreases, since the overdrive is given by VGS-VT, where VGS denotes the gate-to-source voltage and VT denotes the threshold voltage. Similarly, at lower write voltages the overdrive of the PMOS pull-up transistor increases, since the overdrive is given by VSG-VT, where VSG denotes the source-to-gate voltage. This reduced overdrive of the NMOS pass-gate transistor reduces its drive current below the required source current of the PMOS pull-up transistor, leading to the above-noted write failures under worst case local variations.

A conventional approach for addressing the above-described problem is to use a boost signal to provide an additional negative voltage to the bitline during the write operation. Thus, when writing to the memory cell, the bitline is discharged to the negative supply voltage VSS, and then the boost signal is enabled to further reduce the bitline voltage below VSS. This approach, which is also referred to as "negative bootstrapping," increases the NMOS pass gate drive such that the inverter input is driven below its trip point, thereby allowing the data to be written to the memory cell under the above-noted worst case condition. An approach of this type is described in U.S. Patent Application Publication No. 2007/0109878, entitled "Memory Device with Improved Writing Capabilities."

However, the negative bootstrapping approach has a number of significant drawbacks. For example, in this approach the bitline negative voltage must be accurately adjusted above the local threshold voltage variation of the NMOS pass gate to ensure smooth write operations, which is very difficult to do in practice, particularly given the presence of variable bitline capacitances across the wide range of rows in a typical embedded memory array. In addition, one must ensure that the additional negative voltage does not cause the bitline junction to become forward biased. This could cause the memory cells in unaccessed rows to turn on at very low voltage, potentially leading to inadvertent overwriting of the data stored in those memory cells.

A possible alternative approach is to utilize a charge pump to provide a separately-controlled VDD supply voltage to the core portion of the memory cell, where the core portion comprises the four inverter transistors in the 6T SRAM cell. During a write operation when the bitline is discharged to a logic low level, the core VDD voltage is reduced below the VDD voltage used for the pass gate transistors. This reduces the required drive current of the PMOS pull-up transistors, ensuring that the NMOS pass gate is able to drive the inverter input below its trip point, thereby allowing the data to be written to the memory cell under the above-noted worst case condition. However, this approach requires accurate charge pump circuitry as well as variable pumping capacitance over the wide range of rows of the memory array, and is therefore increasingly difficult to implement as device dimensions shrink.

It is therefore apparent that a need exists for an improved approach to configuring memory cells for low voltage write operations and other operating conditions.

SUMMARY OF THE INVENTION

Illustrative embodiments of the present invention overcome one or more drawbacks of the conventional approaches described above at least in part by providing memory cells in which application of power to respective supply nodes of two cross-coupled inverters of a given memory cell is separately controlled. One advantage of such an arrangement is that accurate low voltage write performance can be achieved without the need for negative bootstrapping or charge pumps. Other advantages are obtained in a given illustrative embodiment by combining such separate application of power to inverter supply nodes with improved pass gate circuitry that provides further enhancements relative to conventional memory cells.

In accordance with one aspect of the invention, a memory device includes a memory array comprising a plurality of memory cells. At least a given one of the memory cells comprises a pair of cross-coupled inverters and write assist circuitry. The write assist circuitry comprises first switching circuitry coupled between a supply node of a device of the first inverter and a supply node of the memory cell, and second switching circuitry coupled between a supply node of a device of the second inverter and the supply node of the memory cell. The first and second switching circuitry are separately controlled, with the first switching circuitry being controlled using a wordline and an uncomplemented bitline of the memory device, and the second switching circuitry being controlled using the wordline and a complemented bitline of the memory device.

By way of example, the wordline may comprise a write wordline having a corresponding read wordline, and the uncomplemented and complemented bitlines may comprise respective uncomplemented and complemented write bitlines having respective corresponding uncomplemented and complemented read bitlines.

In an illustrative embodiment, the first switching circuitry comprises a first plurality of write assist transistors connected in parallel with one another with their source and drain terminals coupled between the supply node of the device of the first inverter and the supply node of the memory cell, and the second switching circuitry comprises a second plurality of write assist transistors connected in parallel with one another with their source and drain terminals coupled between the supply node of the device of the second inverter and the supply node of the memory cell. Gate terminals of a first one of the first plurality of write assist transistors and a first one of the second plurality of write assist transistors are coupled to the wordline, and gate terminals of a second one of the first plurality of write assist transistors and a second one of the second plurality of write assist transistors are coupled to respective uncomplemented and complemented bitlines.

The memory cell in this illustrative embodiment further comprises pass gate circuitry, with the pass gate circuitry comprising third switching circuitry coupled between a first internal data node of the cross-coupled inverters and a lower supply node of the memory cell, and fourth switching circuitry coupled between a second internal data node of the cross-coupled inverters and the lower supply node of the memory cell. The third and fourth switching circuitry are separately controlled, with the third switching circuitry being controlled using the wordline and the uncomplemented bitline, and the fourth switching circuitry being controlled using the wordline and the complemented bitline.

A first pass gate transistor of the third switching circuitry has its drain terminal coupled to the first internal data node and its source terminal coupled to the drain terminal of the second pass gate transistor of the third switching circuitry, and a second pass gate transistor of the third switching circuitry has its source terminal coupled to the lower supply node of the memory cell. Similarly, a first pass gate transistor of the fourth switching circuitry has its drain terminal coupled to the second internal data node and its source terminal coupled to the drain terminal of the second pass gate transistor of the fourth switching circuitry, and the second pass gate transistor of the fourth switching circuitry has its source terminal coupled to the lower supply node of the memory cell. The first and second pass gate transistors of the third switching circuitry have their gate terminals coupled to the wordline and the uncomplemented bitline, respectively, and the first and second pass gate transistors of the fourth switching circuitry have their gate terminals coupled to the wordline and the complemented bitline, respectively.

During a write operation of the memory cell, the first and second write assist transistors of the first plurality of transistors are in their respective off states, the first write assist transistor of the second plurality of transistors is in its off state, and the second write assist transistor of the second plurality of transistors is in its on state, such that the supply node of the device of the second inverter is connected to the supply node of the memory cell by the second write assist transistor of the second plurality of transistors, while the supply node of the device of the first inverter is disconnected from the supply node of the memory cell by the first and second write assist transistors of the first plurality of transistors.

Also during the write operation, the first and second pass gate transistors of the third switching circuitry are in their respective on states so as to connect the first internal data node to the lower supply node of the memory cell while at least the second pass gate transistor of the fourth switching circuitry is in its off state such that the second internal data node is not connected to the lower supply node of the memory cell.

Advantageously, the illustrative embodiments provide memory cells having an enhanced write assist capability which ensures accurate writing of data to the memory cells at low voltages, while also avoiding any adverse impact to high voltage write operations, read operations, static noise margin or stored data stability. In addition, write cycle time can be reduced by reducing wordline pulse width. Furthermore, the yield of a memory array comprising such memory cells is also improved.

A memory device in accordance with the invention may be implemented, for example, as a stand-alone memory device, such as a packaged integrated circuit, or as an embedded memory in a microprocessor or other processing device.

DETAILED DESCRIPTION OF THE INVENTION

The invention will be illustrated herein in conjunction with exemplary semiconductor memory devices and associated memory cells as well as other related circuitry. It should be understood, however, that the invention is more generally applicable to any semiconductor memory device in which improved low voltage write performance is desired, and may be implemented using circuitry other than that specifically shown and described in conjunction with the illustrative embodiments.

Figure 1:
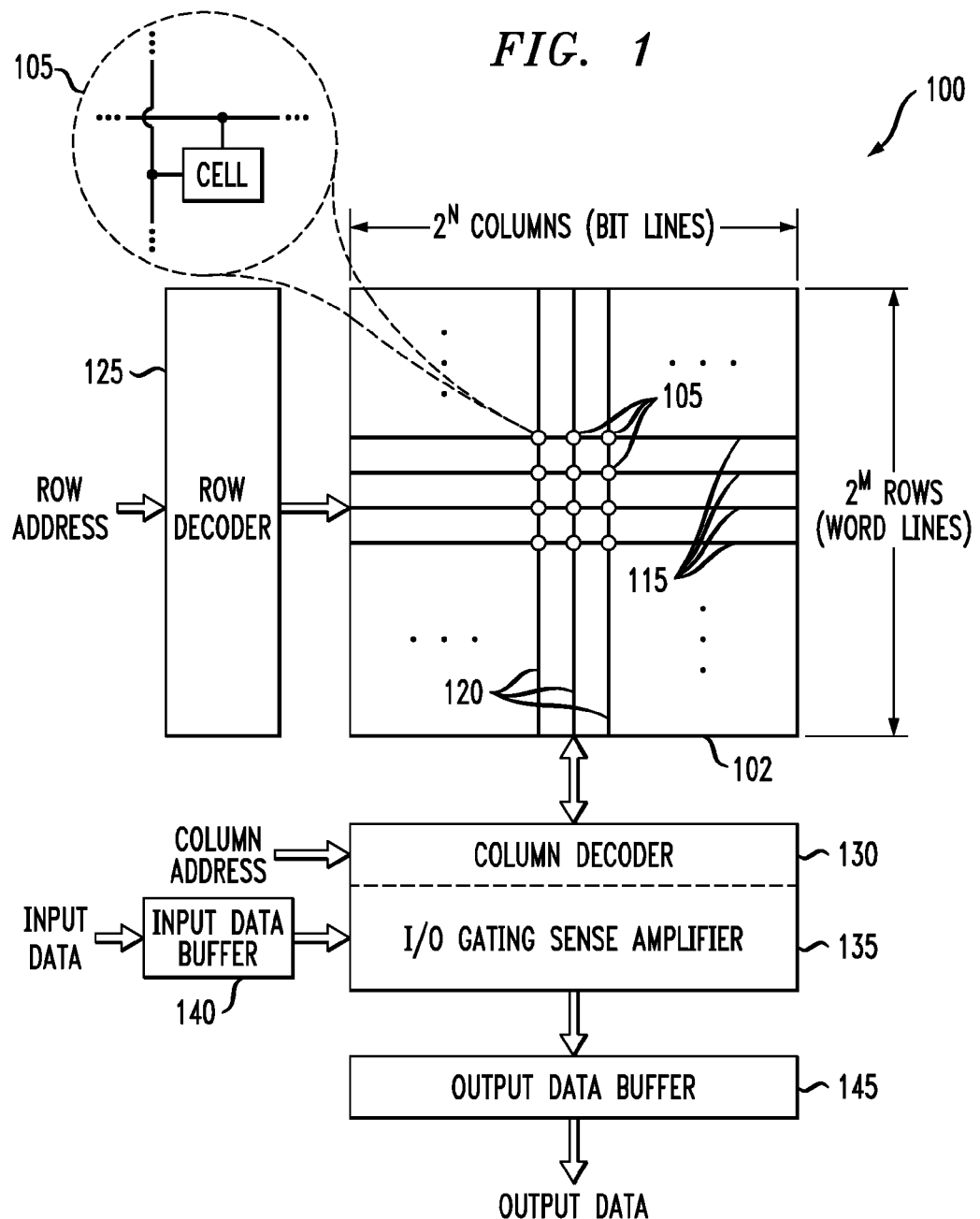
FIG. 1 shows a semiconductor memory device comprising a memory array having a plurality of memory cells each of which incorporates write assist circuitry in an illustrative embodiment of the invention.

FIG. 1 shows a simplified diagram of a memory device 100 in accordance with an illustrative embodiment of the invention. The memory device 100 comprises a memory array 102. The memory array 102 comprises a plurality of memory cells 105 each configured to store data. For example, the memory cells may each be configured to store a single bit of data, and such memory cells are also referred to herein as bit-cells. Each cell 105 is coupled to a corresponding row or wordline 115 and column or bitline 120. The memory array therefore includes a memory cell at each point where a wordline intersects with a bitline. The memory cells of the memory array are illustratively arranged in $2^N$ columns and $2^M$ rows. The values selected for N and M in a given implementation will generally depend upon on the data storage requirements of the application in which the memory device is utilized.

Particular ones of the memory cells 105 of the memory array 102 can be activated for writing data thereto or reading data therefrom by application of appropriate row and column addresses to respective row decoder 125 and column decoder 130. Other elements of the memory device 100 include an input/output (I/O) gating and sense amplifier element 135, an input data buffer 140 and an output data buffer 145. The operation of memory device elements such as row decoder 125, column decoder 130, gating and sense amplifier 135 and buffers 140, 145 is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the gating and sense amplifier 135, or the input and output data buffers 140 and 145.

It should be noted that the memory device 100 in one or more of the illustrative embodiments is assumed to comprise an SRAM device. However, as indicated previously, the disclosed write assist techniques can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. The invention is thus not limited in terms of the particular storage or access mechanism utilized in the memory device.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing the invention.

The present embodiment of memory device 100 is advantageously configured to avoid the drawbacks of conventional practice through the use of improved write assist circuitry implemented in each of the memory cells. As will be described below in conjunction with FIGS. 2 through 5, a given memory cell 105 is configured with an enhanced low voltage write capability that does not require negative bootstrapping or charge pumps.

Figure 2:
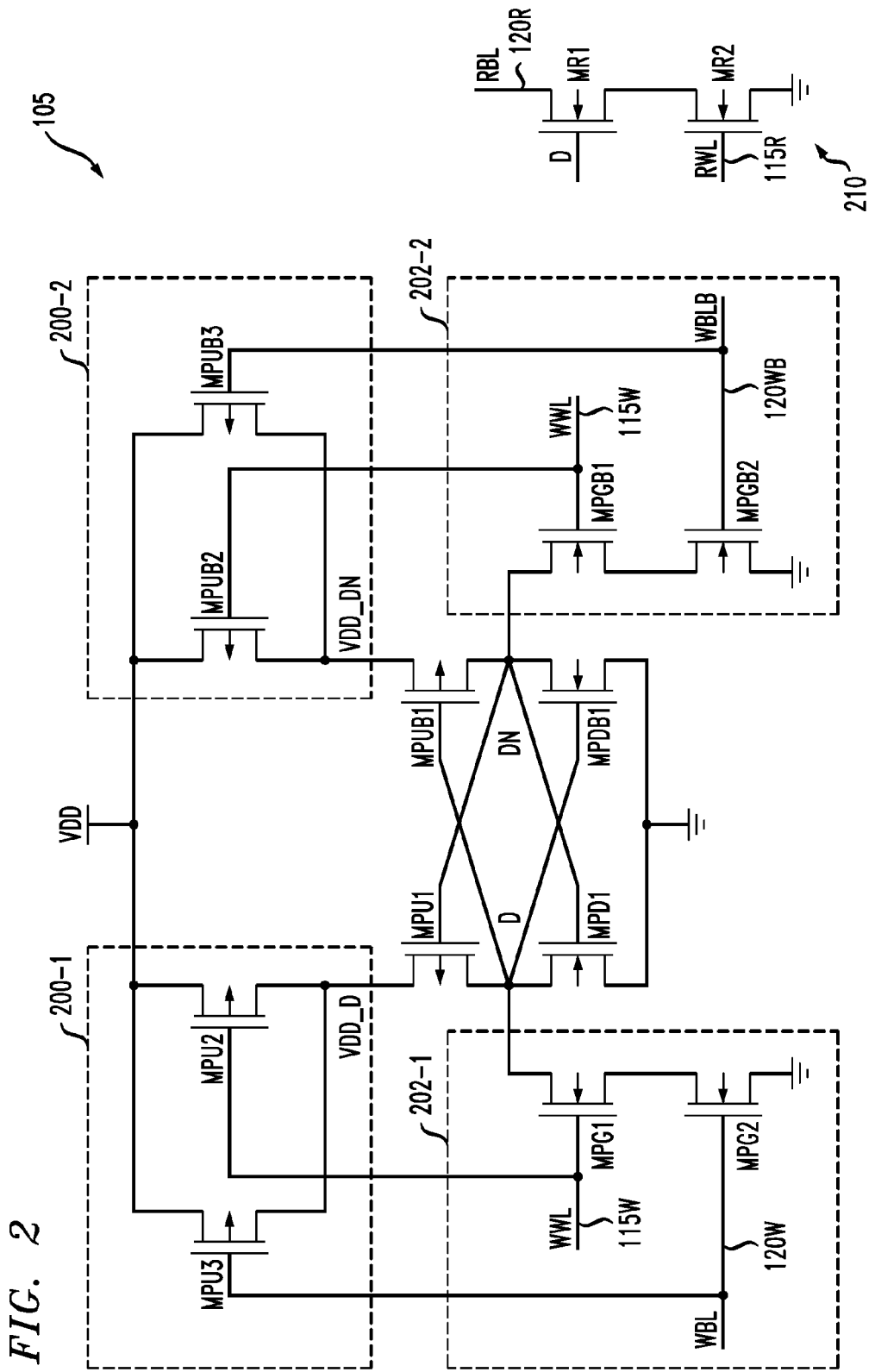
FIG. 2 is a more detailed view showing one possible implementation of a given one of the memory cells in the memory array of the semiconductor memory device of FIG. 1.

FIG. 2 shows the configuration of a given memory cell 105 of the memory array 102. The memory cell 105 in this embodiment is in the form of an SRAM cell that includes a pair of cross-coupled inverters. The pair of cross-coupled inverters more specifically comprises a first inverter comprising PMOS pull-up transistor MPU1 and NMOS pull-down transistor MPD1, and a second inverter comprising PMOS pull-up transistor MPUB 1 and NMOS pull-down transistor MPDB 1. The first and second inverters are also referred to herein as feed-forward and feed-back inverters, respectively, of the memory cell 105. The SRAM cell further comprises write assist circuitry 200 and pass gate circuitry 202. The write assist circuitry 200 includes two separate portions denoted 200-1 and 200-2. These portions collectively comprise four PMOS transistors denoted MPU2, MPU3, MPUB2 and MPUB3. The pass gate circuitry 202 includes two separate portions denoted 202-1 and 202-2. These portions collectively comprise four NMOS pass gate transistors MPG1, MPG2, MPGB1 and MPGB2.

The bitline 120 coupled to memory cell 105 more specifically comprises uncomplemented and complemented write bitlines 120W and 120WB, also denoted WBL and WBLB in the figure. The pass gate transistor MPG1 has its drain terminal coupled to node D of the cross-coupled inverters, and its gate terminal coupled to write wordline 115W, which is also denoted WWL in the figure. Similarly, the pass gate transistor MPGB1 has its drain terminal coupled to node DN of the cross-coupled inverters, and its gate terminal coupled to WWL. The pass gate transistor MPG2 has its drain terminal coupled to the source terminal of MPG1, its source terminal coupled to ground potential, and its gate terminal coupled to WBL. Similarly, the pass gate transistor MPGB2 has its drain terminal coupled to the source terminal of MPGB1, its source terminal coupled to ground potential, and its gate terminal coupled to WBLB.

The first portion 200-1 of the write assist circuitry comprises PMOS transistors MPU2 and MPU3 connected in parallel with one another, with their respective source and drain terminals coupled between supply voltage VDD and node VDD_D. The gate of transistor MPU2 is coupled to WWL, and the gate of transistor MPU3 is coupled to WBL.

The second portion 200-2 of the write assist circuitry comprises PMOS transistors MPUB2 and MPUB3 connected in parallel with one another, with their respective source and drain terminals coupled between supply voltage VDD and node VDD_DN. The gate of transistor MPUB2 is coupled to WWL, and the gate of transistor MPUB3 is coupled to WBLB.

The source terminals of PMOS pull-up transistors MPU1 and MPUB1 are coupled to the respective nodes VDD_D and VDD_DN. The drain terminals of MPU1 and MPUB1 are coupled to the respective drain terminals of NMOS pull-down transistors MPD1 and MPDB1 at respective nodes D and DN. The source terminals of MPD1 and MPDB1 are coupled to ground potential. The cross-coupling of the first inverter comprising MPU1 and MPD1 with the second inverter comprising MPUB1 and MPDB1 is implemented by coupling the gates of transistors MPU1 and MPD1 to node DN and the gates of transistors MPUB1 and MPDB1 to node D.

The supply voltage VDD and ground potential in the FIG. 2 embodiment are examples of what are more generally referred to herein as supply nodes of the memory cell 105, and are to be distinguished from internal supply nodes such as VDD_D and VDD_DN. For example, the memory cell supply node VDD is separated from the internal supply nodes VDD_D and VDD_DN of respective pull-up transistors MPU1 and MPUB1 by the PMOS transistors of the write assist circuitry 200. The memory cell power supply nodes VDD and VSS are also referred to herein as respective upper and lower power supply nodes of the memory cell. Ground potential is an example of the lower supply node VSS.

Also included in the memory cell 105 is additional circuitry 210 comprising first and second NMOS read transistors MR1 and MR2. The read transistor MR1 has its drain terminal coupled to a read bitline 120R, also denoted RBL in the figure, and its gate terminal coupled to node D of the cross-coupled inverters. The read transistor MR2 has its drain terminal coupled to the source terminal of MR1, its source terminal coupled to ground potential, and its gate terminal coupled to a read wordline 115R, also denoted RWL in the figure. The additional circuitry 210 and the configuration of separate read and write bitlines and wordlines serves to isolate the read path from the write path in the memory cell 105, thereby improving static noise margin relative to a conventional 6T memory cell in which such paths are not isolated.

The memory cell 105 as shown in FIG. 2 can be configured to perform a number of different types of operations, including, by way of example, a write operation without the use of a bit-write mask, a write operation with the use of a bit-write mask, and a read operation. The configuration of the memory cell 105 in these exemplary operations will be described below with reference to FIGS. 3, 4 and 5, respectively.

Figure 3:
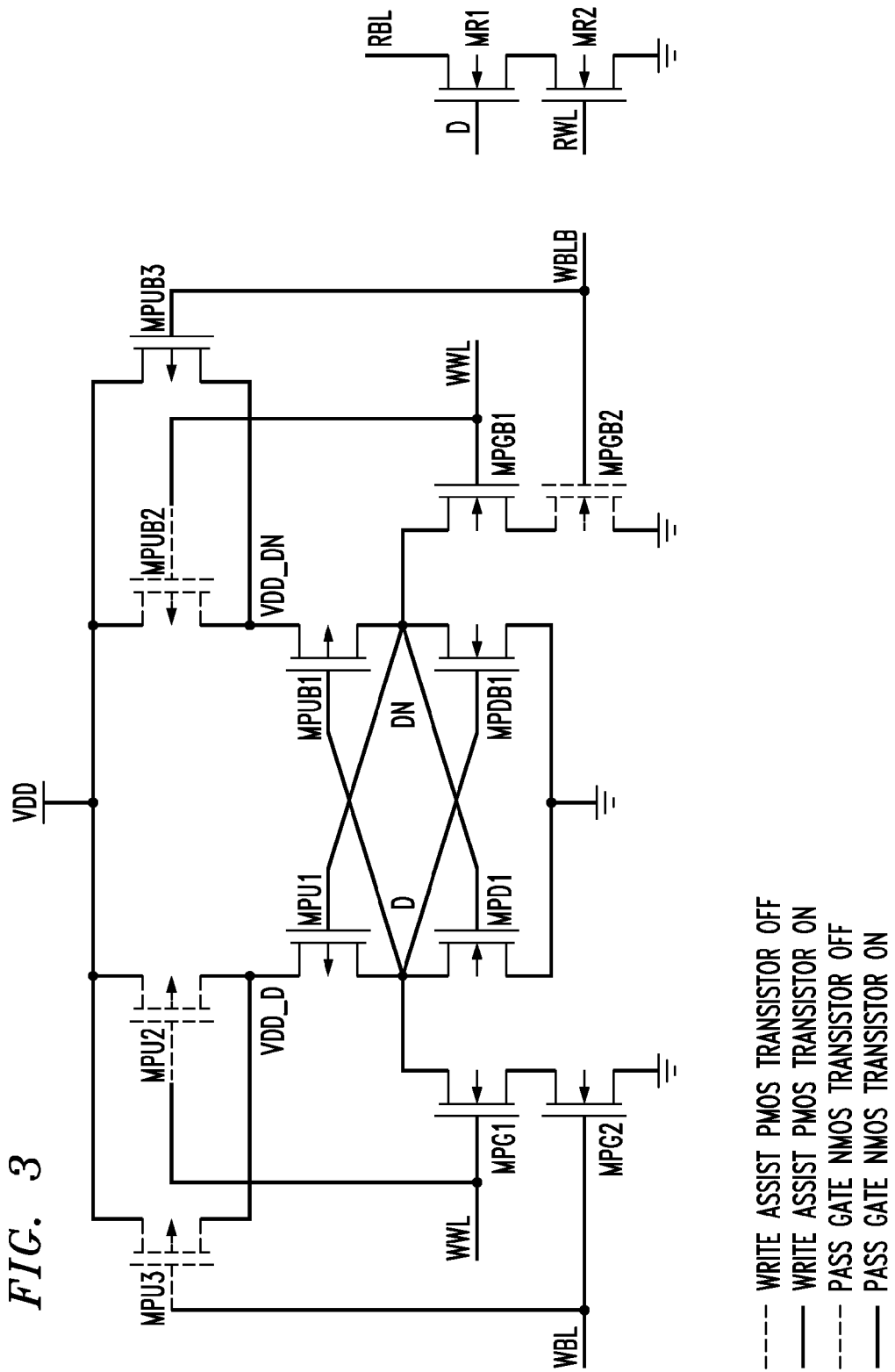
FIG. 3 illustrates the configuration of the memory cell of FIG. 2 for a write operation without the use of a bit-write mask.
Figure 4:
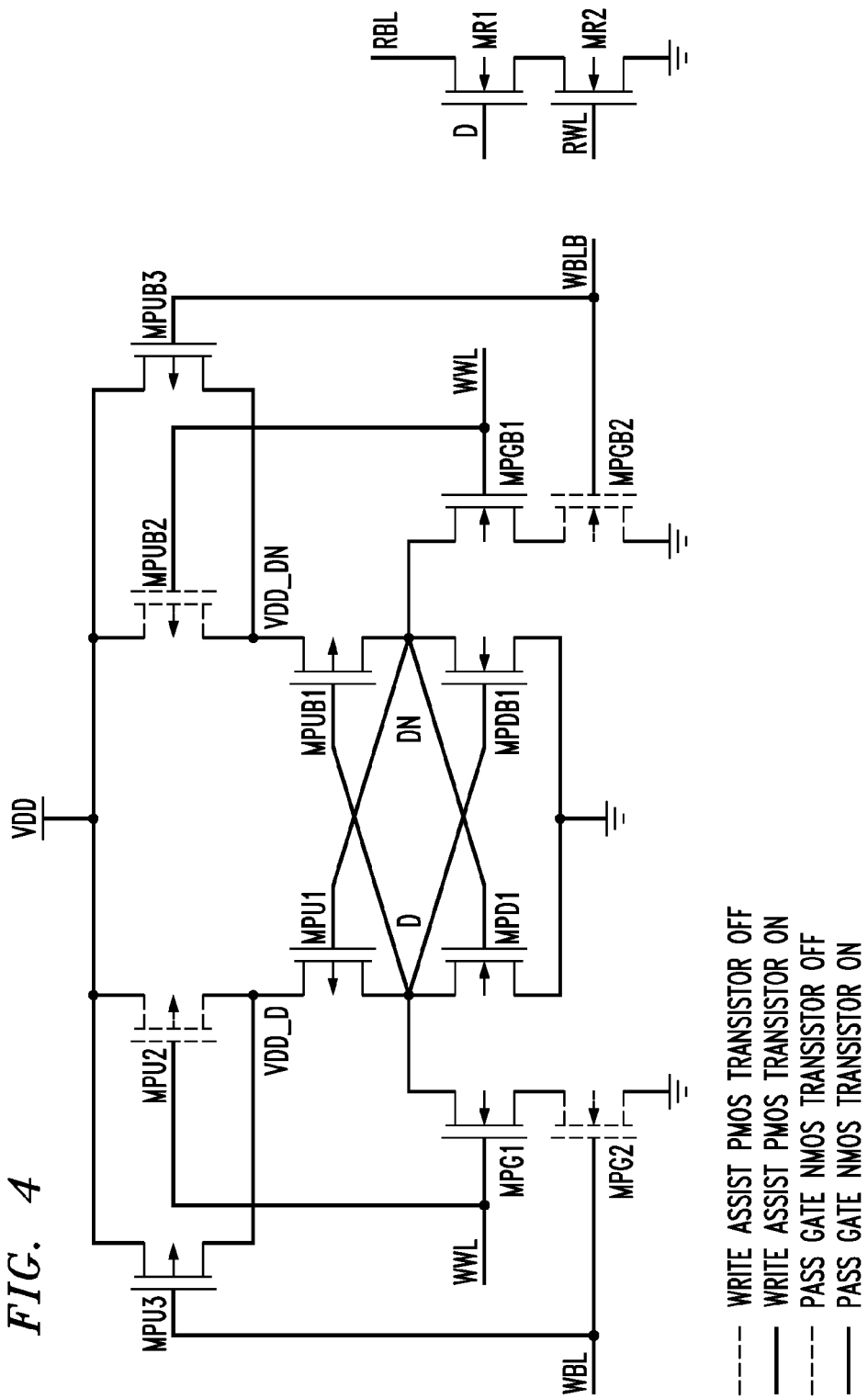
FIG. 4 illustrates the configuration of the memory cell of FIG. 2 for a write operation with the use of a bit-write mask.
Figure 5:
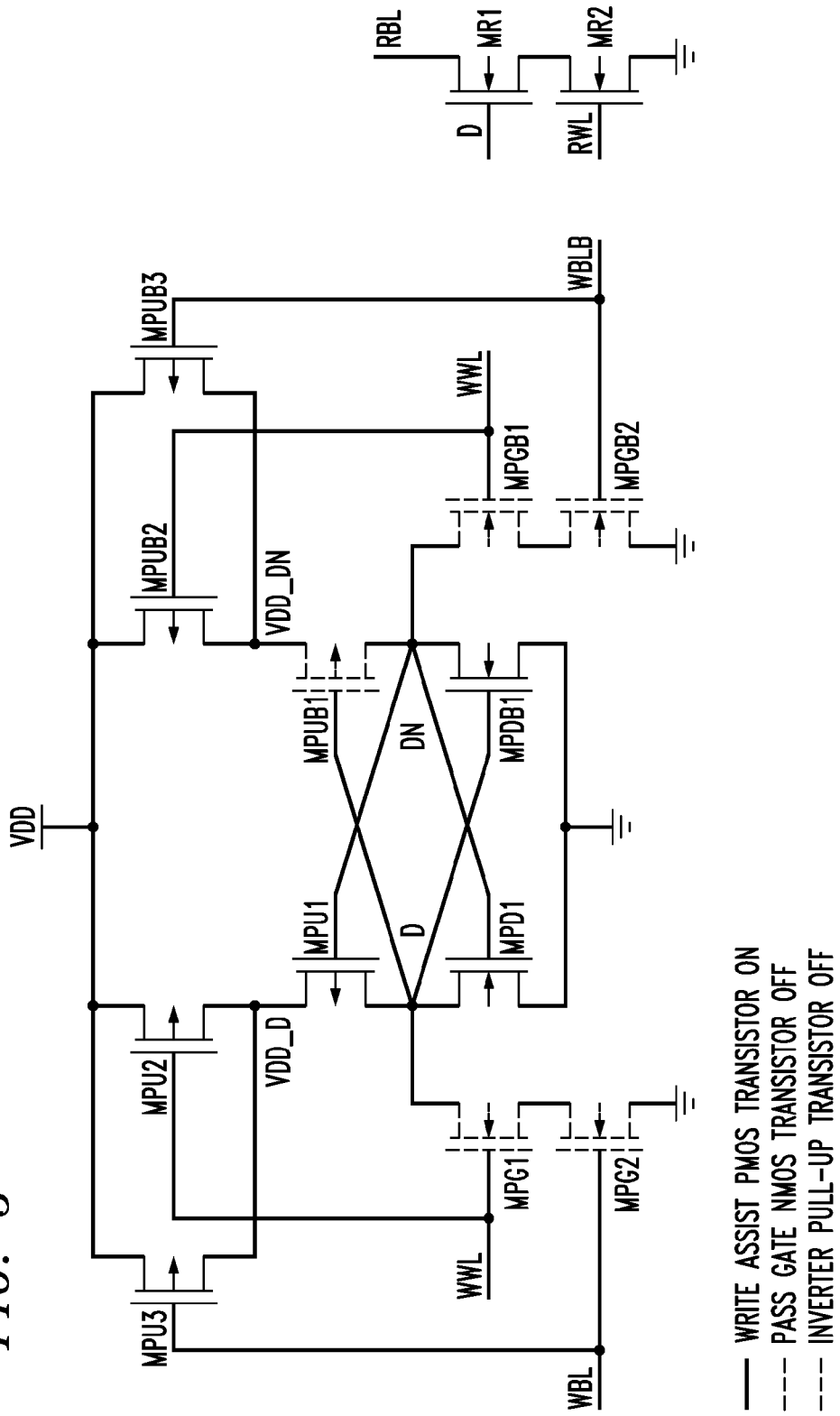
FIG. 5 illustrates the configuration of the memory cell of FIG. 2 for a read operation.

Referring now to FIG. 3, the configuration of the memory cell 105 is shown for the write operation without use of the bit-write mask. The states of the respective transistors of the write assist circuitry 200 and pass gate circuitry 202 in FIGS. 3, 4 and 5 are indicated by whether those devices are shown in dashed or solid lines, with the use of dashed lines for a given write assist or pass gate transistor indicating that the device is cut off (i.e., in its non-conducting or off state), and the use of solid lines for a given write assist or pass gate transistor indicating that the device is turned on (i.e., in its conducting or on state).

Prior to initiating a given write operation involving the memory cell 105, WBL and WBLB are both pre-discharged to VSS, and WWL is set to VSS. This ensures that the internal power supply nodes VDD_D and VDD_DN will both settle to VDD through the corresponding parallel combinations of PMOS transistors MPU2-MPU3 and MPUB2-MPUB3, respectively, which are all initially in their on states. Pass gate transistors MPG1, MPGB1, MPG2 and MPGB2, which have their gates coupled to WBL, WBLB or WWL, are initially in their off states. As indicated previously, the internal power supply nodes VDD_D and VDD_DN are examples of what are more generally referred to herein as supply nodes associated with respective pull-up devices of a pair of cross-coupled inverters.

During the write operation illustrated in FIG. 3, RBL is precharged to VDD and RWL is set to a logic low level such that transistor MR2 is in its off state and the write operation is not disturbed by circuitry 210. Assume the data to be written to the memory cell is a logic low level or "0" bit. In this case, WBL is pulled up to VDD while WBLB is retained at VSS. After WBL charges to VDD, WWL is pulled up to VDD. This turns on the pass gate transistors MPG1 and MPG2 to create a conducting path from node D to ground. Since WBLB is retained at VSS, internal supply node VDD_DN is connected to the memory cell supply node VDD through the PMOS transistor MPUB3. Also, the internal supply node VDD_D is disconnected from the memory cell supply node VDD because the PMOS transistors MPU2 and MPU3 are turned off, and thus the internal supply node VDD_D is floating.

As a result, static current through the PMOS pull-up transistor MPU1 is negligible during the write operation, regardless of local variations in PMOS pull-up transistor and NMOS pass gate transistor threshold voltages. This ensures that the NMOS pass gate transistors MPG1 and MPG2 will be able to drive node D below the trip point of the inverter comprising MPUB1 and MPDB1 even with minimal drive current.

Once node D is below the trip point, MPUB1 turns on and charges node DN to VDD through transistor MPUB3. Nodes D and DN therefore reflect the new data written to the memory cell via pass gate transistors MPG1 and MPG2. These nodes D and DN in the present embodiment are examples of what are more generally referred to herein as respective first and second internal data nodes. Since internal power supply node VDD_DN is set to VDD prior to initiating the write operation, node DN will recover to VDD within a short time. Also, since internal power supply node VDD_D is floating, node D discharges below the trip point of the inverter within a predictable duration, and this predictability can be used to minimize wordline pulse width and thereby improve write cycle time (i.e., the time duration of the write operation).

FIG. 4 shows the configuration of the memory cell 105 for the write operation with use of the bit-write mask. In this operation, the memory cell is being masked from write. The states of the PMOS transistors MPU2, MPUB2, MPU3 and MPUB3 prior to initiation of the write operation are as described previously.

During the bit-write mask operation illustrated in FIG. 4, WBL and WBLB will be driven to VSS and WWL is set to VDD. This turns on transistors MPU3 and MPUB3 as shown, connecting nodes VDD_D and VDD_DN to VDD. Since WBL and WBLB are set to VSS, the NMOS pass gate transistors MPG2 and MPGB2 will both be turned off, thereby preventing discharge of nodes D and DN, and ensuring that these nodes will continue to reflect the old data previously stored in the memory cell.

FIG. 5 shows the configuration of the memory cell 105 for the read operation. Prior to initiating the read operation, RBL is precharged to VDD and all other control signals are set to VSS. During the read operation, the control signals WBL, WBLB and WWL are set to VSS and the RBL precharge is released. RWL is turned on, causing discharge of RBL in the case of reading a "0" bit from the cell. The discharged voltage level can then be read out through sense amplifier 135 and into output data buffer 145. Again, nodes D and DN therefore continue to reflect the old data previously stored in the memory cell.

The memory cell 105 as described in conjunction with FIGS. 2 through 5 above provides a number of advantages relative to conventional arrangements. As indicated previously, this memory cell has an enhanced low voltage write capability that does not require negative bootstrapping or charge pumps. Also, this low voltage write capability is provided without adversely impacting high voltage write operations, read operations, or static noise margin. Furthermore, write cycle time can be reduced by reducing wordline pulse width. The yield of a memory array comprising such cells is also improved.

Embodiments of the memory cell 105 can be implemented in a wide variety of different memory applications. For example, the memory cell 105 as shown in FIG. 2 exhibits a significantly improved write speed and is well-suited for use in content addressable memories (CAMs) that require write and compare operations to be performed within the same cycle. As another example, the memory cell 105 may be implemented in a register file, such as a register file having a single write port and multiple read ports.

It should be noted that use of PMOS transistors and NMOS transistors in the particular embodiment of the memory cell 105 as described above is by way of illustrative example. In other embodiments, the conductivity types of certain ones of the various transistors may be reversed, as would be appreciated by one skilled in the art. As a more particular example, the PMOS transistors of the write assist circuitry may be replaced with NMOS transistors and the NMOS pass gate transistors may be replaced with PMOS pass gate transistors, in conjunction with other straightforward modifications of the circuitry arrangements.

A given memory device configured in accordance with the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory implemented within a microprocessor, digital signal processor (DSP), application-specific integrated circuit (ASIC), field-programmable gate array (FPGA) or other type of processor or integrated circuit device.

Figure 6:
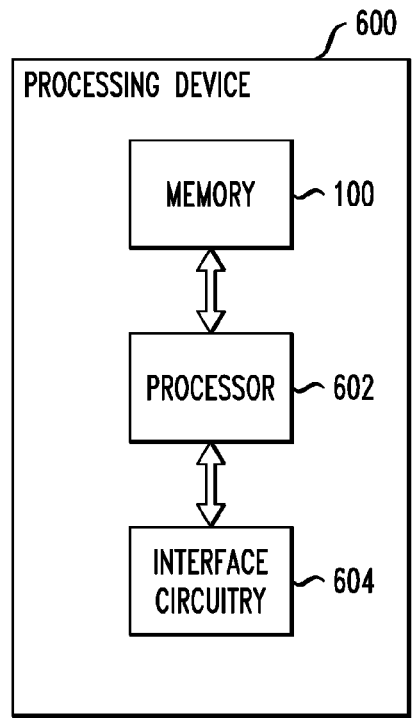
FIG. 6 is a block diagram of a processing device which incorporates the memory device of FIG. 1.

FIG. 6 shows an example of a processing device 600 which incorporates the memory device 100 of FIG. 1. In this embodiment, the memory device 100 is coupled to a processor 602. The processing device further includes interface circuitry 604 coupled to the processor 602. The processing device 600 may comprise, for example, a computer, a server or a portable communication device such as a mobile telephone. The interface circuitry 604 may comprise one or more transceivers for allowing the device 600 to communicate over a network.

Figure 7:
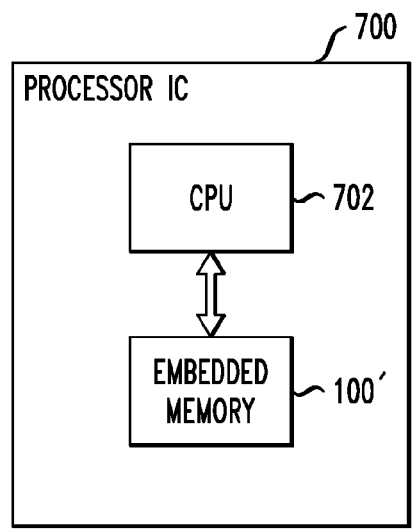
FIG. 7 is a block diagram of a processor integrated circuit which incorporates the memory device of FIG. 1 as an embedded memory.

Alternatively, processing device 600 may comprise a microprocessor, DSP or ASIC, with processor 602 corresponding to a central processing unit (CPU) and memory device 100 providing at least a portion of an embedded memory of the microprocessor, DSP or ASIC. FIG. 7 shows an example of an arrangement of this type, with processor integrated circuit 700 incorporating the memory device of FIG. 1 as an embedded memory 100'. The embedded memory 100' in this embodiment is coupled to a CPU 702.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

As indicated above, alternative memory cells 105 may be used in other embodiments. One example of such an alternative memory cell arrangement is a memory cell that includes PMOS pass gate transistors and NMOS write assist transistors. The operation of such a memory cell is otherwise generally analogous to that of the FIG. 2 memory cell as previously described.

Again, it should be emphasized that the above-described embodiments of the invention are intended to be illustrative only. For example, other embodiments can use different types and arrangements of memory arrays, memory cell circuitry, write assist circuitry, transistor conductivity types, control signals, and other elements for implementing the described functionality. These and numerous other alternative embodiments within the scope of the following claims will be apparent to those skilled in the art.

What is claimed is:

1. A memory device comprising:
a memory array comprising a plurality of memory cells;
at least a given one of the memory cells comprising:
a pair of cross-coupled inverters; and
write assist circuitry;
the write assist circuitry comprising:
first switching circuitry coupled between a supply node of a device of the first inverter and a supply node of the memory cell; and
second switching circuitry coupled between a supply node of a device of the second inverter and the supply node of the memory cell;
wherein the first and second switching circuitry are separately controlled, with the first switching circuitry being controlled using a wordline and an uncomplemented bitline of the memory device, and the second switching circuitry being controlled using the wordline and a complemented bitline of the memory device.

2. The memory device of claim 1 wherein the wordline comprises a write wordline having a corresponding read wordline and the uncomplemented and complemented bitlines comprise respective uncomplemented and complemented write bitlines having respective corresponding uncomplemented and complemented read bitlines.

3. The memory device of claim 1 wherein first and second write assist transistors of the first switching circuitry have gate terminals coupled to the wordline and the uncomplemented bitline, respectively, and first and second write assist transistors of the second switching circuitry have gate terminals coupled to the wordline and the complemented bitline, respectively.

4. The memory device of claim 1 wherein the first switching circuitry is coupled between a supply node of a pull-up device of the first inverter and an upper power supply node of the memory cell, the second switching circuitry is coupled between a supply node of a pull-up device of the second inverter and the upper power supply node of the memory cell, and the first and second switching circuitry are separately controlled such that during a write operation of the memory cell the supply node of one of the pull-up devices is connected to the upper power supply node while the supply node of the other pull-up device is not connected to the upper power supply node but is instead permitted to float.

5. The memory device of claim 4 wherein the pull-up devices of the first and second inverters comprise respective pull-up transistors and the first and second inverters further comprise respective pull-down transistors.

6. The memory device of claim 5 wherein source terminals of the pull-up transistors are coupled to respective ones of the device supply nodes, drain terminals of the pull-up transistors are coupled to respective drain terminals of the pull-down transistors at respective first and second internal data nodes of the cross-coupled inverters, source terminals of the pull-down transistors are coupled to ground potential, and the first inverter is cross-coupled to the second inverter by coupling gates of the pull-up and pull-down transistors of the first inverter to the second internal data node and gates of the pull-up and pull-down transistors of the second inverter to the first internal data node.

7. The memory device of claim 1 wherein:
the first switching circuitry comprises a first plurality of write assist transistors connected in parallel with one another with their source and drain terminals coupled between the supply node of the device of the first inverter and the supply node of the memory cell; and
the second switching circuitry comprises a second plurality of write assist transistors connected in parallel with one another with their source and drain terminals coupled between the supply node of the device of the second inverter and the supply node of the memory cell;
wherein gate terminals of a first one of the first plurality of write assist transistors and a first one of the second plurality of write assist transistors are coupled to the wordline; and
wherein gate terminals of a second one of the first plurality of write assist transistors and a second one of the second plurality of write assist transistors are coupled to respective uncomplemented and complemented bitlines.

8. The memory device of claim 7 wherein during a write operation of the memory cell the first and second write assist transistors of the first plurality of write assist transistors are in their respective off states, the first write assist transistor of the second plurality of write assist transistors is in its off state, and the second write assist transistor of the second plurality of write assist transistors is in its on state, such that the supply node of the device of the second inverter is connected to the supply node of the memory cell by the second write assist transistor of the second plurality of write assist transistors, while the supply node of the device of the first inverter is disconnected from the supply node of the memory cell by the first and second write assist transistors of the first plurality of write assist transistors.

9. The memory device of claim 1 wherein the memory cell further comprises pass gate circuitry, the pass gate circuitry comprising:
third switching circuitry coupled between a first internal data node of the cross-coupled inverters and a lower supply node of the memory cell;
fourth switching circuitry coupled between a second internal data node of the cross-coupled inverters and the lower supply node of the memory cell;
wherein the third and fourth switching circuitry are separately controlled, with the third switching circuitry being controlled using the wordline and the uncomplemented bitline, and the fourth switching circuitry being controlled using the wordline and the complemented bitline.

10. The memory device of claim 9 wherein first and second pass gate transistors of the third switching circuitry have gate terminals coupled to the wordline and the uncomplemented bitline, respectively, and first and second pass gate transistors of the fourth switching circuitry have gate terminals coupled to the wordline and the complemented bitline, respectively.

11. The memory device of claim 10 wherein:
the first pass gate transistor of the third switching circuitry has its drain terminal coupled to the first internal data node and its source terminal coupled to the drain terminal of the second pass gate transistor of the third switching circuitry;
the second pass gate transistor of the third switching circuitry has its source terminal coupled to the lower supply node of the memory cell;
the first pass gate transistor of the fourth switching circuitry has its drain terminal coupled to the second internal data node and its source terminal coupled to the drain terminal of the second pass gate transistor of the fourth switching circuitry; and
the second pass gate transistor of the fourth switching circuitry has its source terminal coupled to the lower supply node of the memory cell.

12. The memory device of claim 11 wherein during a write operation of the memory cell the first and second pass gate transistors of the third switching circuitry are in their respective on states so as to connect the first internal data node to the lower supply node of the memory cell while at least the second pass gate transistor of the fourth switching circuitry is in its off state such that the second internal data node is not connected to the lower supply node of the memory cell.

13. An integrated circuit comprising the memory device of claim 1.

14. A processing device comprising the memory device of claim 1.

15. A method comprising:
providing a memory cell comprising a pair of cross-coupled inverters, write assist circuitry and pass gate circuitry; and
during a write operation of the memory cell:
configuring the write assist circuitry to connect an upper supply node of a device of one of the inverters to an upper supply node of the memory cell responsive to a wordline signal and one of an uncomplemented bitline signal and a complemented bitline signal while an upper supply node of a device of another one of the inverters is not connected to the upper supply node of the memory cell responsive to the wordline signal and the other of the uncomplemented bitline signal and the complemented bitline signal; and
configuring the pass gate circuitry to connect one of a first internal data node and a second internal data node of the cross-coupled inverters to a lower supply node of the memory cell while the other of the first internal data node and the second internal data node of the cross-coupled inverters is not connected to the lower supply node of the memory cell;
wherein configuring the write assist circuitry comprises:
configuring first switching circuitry coupled between the upper supply node of the device of one of the inverters and the upper supply node of the memory cell using the wordline signal and the uncomplemented bitline signal; and
configuring second switching circuitry coupled between the upper supply node of the device of the other one of the inverters and the upper supply node of the memory cell using the wordline signal and the complemented bitline signal.

16. The method of claim 15 wherein the configuring steps further comprise:
applying a write wordline signal to first transistors in each of first and second pluralities of transistors of the write assist circuitry;
applying an uncomplemented write bitline signal to a second transistor in the first plurality of transistors of the write assist circuitry;
applying a complemented write bitline signal to a second transistor in the second plurality of transistors of the write assist circuitry;
applying the write wordline signal to first transistors in each of first and second pluralities of transistors of the pass gate circuitry;

applying the uncomplemented write bitline signal to a second transistor in the first plurality of transistors of the pass gate circuitry; and applying the complemented write bitline signal to a second transistor in the second plurality of transistors of the pass gate circuitry.

17. A memory cell comprising:

a pair of cross-coupled inverters; and write assist circuitry;

the write assist circuitry comprising:

first switching circuitry coupled between a supply node of a device of the first inverter and a supply node of the memory cell; and second switching circuitry coupled between a supply node of a device of the second inverter and the supply node of the memory cell;

wherein the first and second switching circuitry are separately controlled, with the first switching circuitry being controlled using a wordline and an uncomplemented bitline associated with the memory cell, and the second switching circuitry being controlled using the wordline and a complemented bitline associated with the memory cell.

18. The memory cell of claim 17 wherein:

the first switching circuitry comprises a first plurality of transistors connected in parallel with one another with their source and drain terminals coupled between the supply node of the device of the first inverter and the supply node of the memory cell; and the second switching circuitry comprises a second plurality of transistors connected in parallel with one another with their source and drain terminals coupled between the supply node of the device of the second inverter and the supply node of the memory cell;

wherein gate terminals of a first one of the first plurality of transistors and a first one of the second plurality of transistors are coupled to the wordline; and wherein gate terminals of a second one of the first plurality of transistors and a second one of the second plurality of transistors are coupled to the uncomplemented and complemented bitlines, respectively.

19. The memory cell of claim 17 wherein the memory cell further comprises pass gate circuitry, the pass gate circuitry comprising:

third switching circuitry coupled between a first internal data node of the cross-coupled inverters and a lower supply node of the memory cell;

fourth switching circuitry coupled between a second internal data node of the cross-coupled inverters and the lower supply node of the memory cell;

wherein the third and fourth switching circuitry are separately controlled, with the third switching circuitry being controlled using the wordline and the uncomplemented bitline, and the fourth switching circuitry being controlled using the wordline and the complemented bitline, respectively.

20. The memory cell of claim 19 wherein:

first and second pass gate transistors of the third switching circuitry have gate terminals coupled to the wordline and the uncomplemented bitline, respectively;

first and second pass gate transistors of the fourth switching circuitry have gate terminals coupled to the wordline and the complemented bitline, respectively;

the first pass gate transistor of the third switching circuitry has its drain terminal coupled to the first internal data node and its source terminal coupled to the drain terminal of the second pass gate transistor of the third switching circuitry;

the second pass gate transistor of the third switching circuitry has its source terminal coupled to the lower supply node of the memory cell;

the first pass gate transistor of the fourth switching circuitry has its drain terminal coupled to the second internal data node and its source terminal coupled to the drain terminal of the second pass gate transistor of the fourth switching circuitry; and the second pass gate transistor of the fourth switching circuitry has its source terminal coupled to the lower supply node of the memory cell.

* * * * *